United States Patent [19]
Hviid et al.

[11] Patent Number: 5,243,616
[45] Date of Patent: Sep. 7, 1993

[54] CIRCUIT FOR CONTROLLING THE THYRATRON IN A PULSE CONTROLLED METAL VAPOR LASER

[75] Inventors: Erling Hviid, Kirke Sonnerup; Kenny T. Jensen, Slangerup, both of Denmark

[73] Assignee: PBI Development A/S, Denmark

[21] Appl. No.: 771,476

[22] Filed: Oct. 7, 1991

[30] Foreign Application Priority Data

Oct. 8, 1990 [DK] Denmark .................. 2429/90

[51] Int. Cl.$^5$ .......................................... H01S 3/097
[52] U.S. Cl. .................................. 372/38; 372/33; 372/81
[58] Field of Search .................... 372/38, 33, 81

[56] References Cited

U.S. PATENT DOCUMENTS

| | | | |
|---|---|---|---|
| 2,830,178 | 4/1958 | White | 250/27 |
| 2,907,900 | 10/1959 | Hoyer et al. | 307/106 |
| 3,646,395 | 2/1972 | De Pratti | 315/242 P |
| 4,112,392 | 9/1978 | Andersson | 372/38 |

FOREIGN PATENT DOCUMENTS

| | | |
|---|---|---|
| 3843210 | 6/1990 | Fed. Rep. of Germany . |
| 1418571 | 12/1975 | United Kingdom . |
| 8701882 | 3/1987 | World Int. Prop. O. . |

OTHER PUBLICATIONS

Shimon Gabay et al., "Do-It-Yourself Copper-Vapour Laser", *Laser Focus*, Jun., 1979, pp. 70–73.

*Primary Examiner*—James W. Davie
*Attorney, Agent, or Firm*—Wegner, Cantor, Mueller & Player

[57] ABSTRACT

In order to avoid that the thyratron in a conventional laser pulse discharge circuit latches up in its conductive condition, a control circuit is introduced, which ensures that the thyratron is only triggered in intervals where the voltage across the primary coil L1 is decreasing or has reached an oscillation amplitude which is below a predetermined level.

4 Claims, 1 Drawing Sheet

CIRCUIT FOR CONTROLLING THE THYRATRON IN A PULSE CONTROLLED METAL VAPOR LASER

BACKGROUND OF THE INVENTION

The invention relates to a circuit for controlling a thyratron in a conventional laser pulse discharge circuit, consisting of a high voltage supply, the output terminals of which are connected to a series connection of a primary coil, a diode and the thyratron, and a series connection of a condenser and the laser tube are connected parallel with the thyratron, and a secondary coil is connected parallel with the laser tube.

Such laser pulse discharge circuits have the disadvantage that the thyratron sometimes is latched up in its conductive condition, whereby the high voltage supply is shortcircuited. In order to avoid this problem various circuits have been developed such as, e.g. disclosed in WO 87/01882, which ensure that such a latch-up is prevented. However, such a circuit has various disadvantages as compared to the basic circuit described above. The circuit disclosed in WO 87/01882 increases the losses in the discharge circuit and the added components of the high voltage part entail a higher price, and an increased probability of malfunctions.

SUMMARY OF THE INVENTION

It is thus the object of the invention to provide a control circuit for controlling the thyratron in the conventional laser pulse discharge circuit, thereby preventing the occurrence of latch-ups.

This is obtained by means of a control circuit which is characterized in that it is arranged so that it only gives off trigger pulses to the thyratron in intervals where the voltage across the primary coil is decreasing or has reached an oscillation amplitude which is below a predetermined level.

By only giving off trigger pulses to the thyratron as described above, thyratron latch-ups are totally avoided.

A particularly simple circuit is obtained by detecting the voltage across the primary coil by means of a capacitive pick-up which forms a small capacity to the primary coil. In addition, a well-functioning insulation is obtained between the high voltage circuit and the logical circuit for giving off trigger pulses to the thyratron.

By connecting the capacitive pick-up to a pick-up amplifier/discriminator which gives off a signal to the control circuit, which signal indicates whether the thyratron may be triggered, a very simple logical control of the trigger pulses to the thyratron can be obtained, as an external trigger pulse to the thyratron is transferred to the latter when the pick-up amplifier/discriminator signal indicates that this is allowed.

BRIEF DESCRIPTION OF THE DRAWING

The invention is further explained in the following example of an embodiment with reference to the drawing, in which.

DETAILED DESCRIPTION OF THE PREFERRED EMBODIMENT

Figure 1:
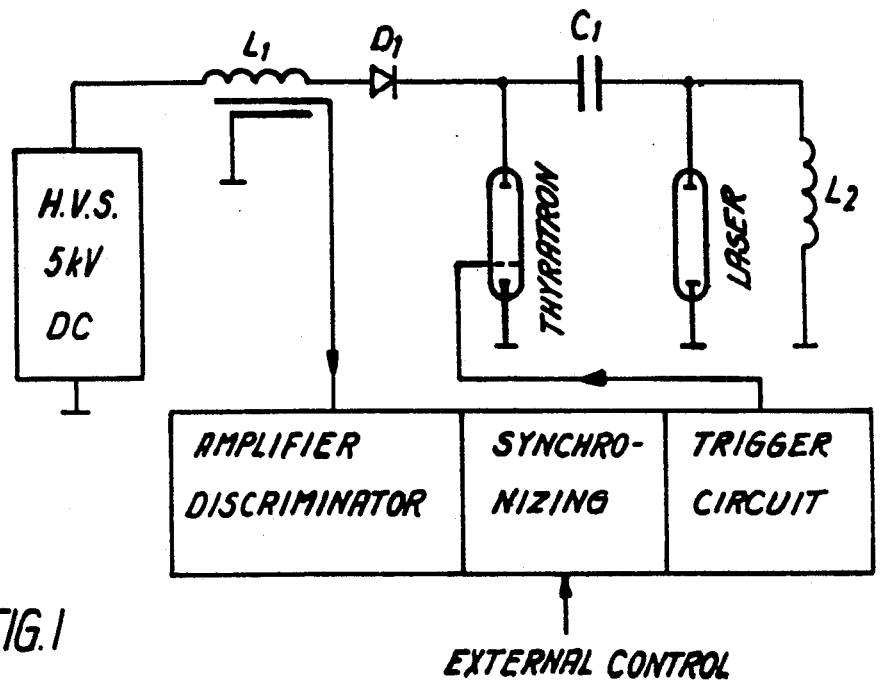
FIG. 1 is a schematical drawing showing the circuit according to the invention.

FIG. 1 shows a laser pulse discharge circuit comprising as conventional components a high voltage DC supply, a primary coil L1, a diode D1, a thyratron, a condenser C1 and a laser discharge tube connected parallel with a secondary coil L2. The control circuit for giving off trigger pulses to the thyratron according to the invention comprises a capacitive pick-up PU, an amplifier/discriminator circuit connected to a synchronizing unit with input for an external trigger input signal and a trigger pulse circuit for giving off trigger pulses to the control terminal of the thyratron.

Figure 2:
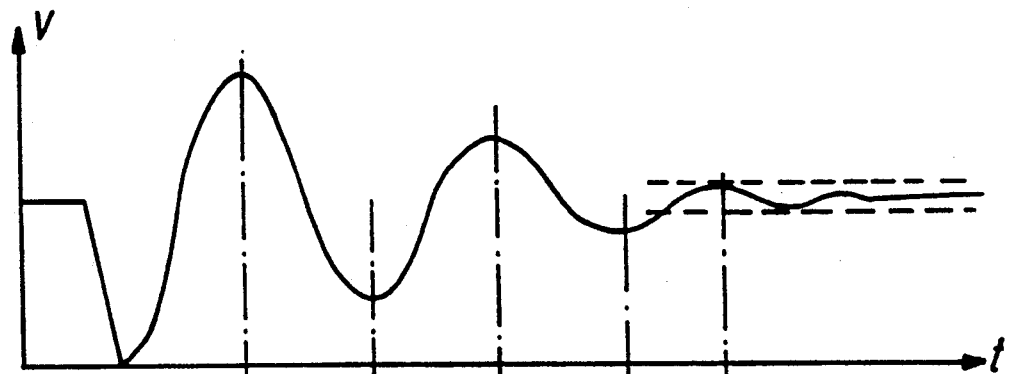
FIG. 2 shows a typical output voltage of the primary coil in FIG. 1.
Figure 3:
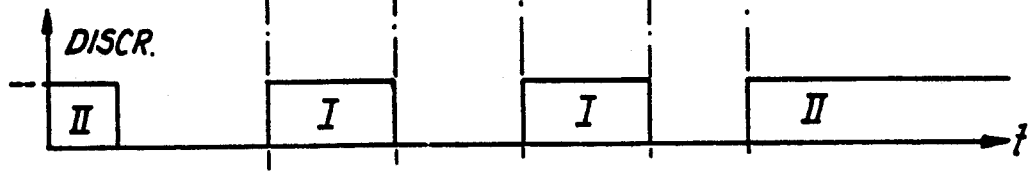
FIG. 3 shows the permitted intervals corresponding to FIG. 2 for giving off trigger pulses to the thyratron.

The capacitive pick-up PU detects the voltage across the primary coil L1 as, e.g. shown in FIG. 2. On the basis of this signal it generates a signal as shown in FIG. 3 to the amplifier/discriminator connected to the capacitive pick-up, which signal allows the transfer of trigger pulses, either when the voltage across the primary coil L1 is decreasing I, or when the oscillation amplitude of this voltage has fallen below level II.

In this way, as soon as an external trigger signal is received, the thyratron will be triggered in the first given interval of decreasing voltage across the primary coil L1, or when the oscillation amplitude is below the predetermined level, i.e. either immediately or after maximum half of the voltage oscillation period of the first coil L1 has elapsed. With the circuit according to the invention, triggering (the external trigger signal) can be received arbitrarily without considering the condition of the circuit. It is thus possible to control the laser according to a pulse/pause system in which laser beams are emitted in the pulse interval, but nothing during the pause. The need for a fast closing mechanism is thereby circumvented, which must be capable of resisting the high laser effect to ensure this mode of operation which is indispensable in the field of dermatology, for example.

The control circuit may conceivably be built together with the rest of the laser control system as long as it ensures that trigger pulses are only given off to the thyratron inside the allowed intervals.

We claim:

1. A control circuit for controlling a laser pulse discharge circuit comprising a high voltage supply having output terminals connected to a series connection of a primary coil, a diode and a thyratron, a series connection of a condenser and a laser tube being connected in parallel with said thyratron, and a secondary coil being connected in parallel with said laser tube, said control circuit being connected to detection means for detecting the voltage across said primary coil and being arranged to cause a trigger pulse to be supplied to said thyratron in response to a signal from said detection means only in intervals where the voltage across said primary coil is decreasing or has reached an oscillation amplitude which is below a predetermined level.

2. A circuit ass claimed in claim 1, wherein said detection means comprises a capacitive pick-up forming a small capacity to the primary coil.

3. A circuit as claimed in claim 2, wherein said capacitive pick-up is connected to a pick-up amplifier/discriminator, which gives off a signal to said control circuit indicating whether said thyratron may be triggered.

4. A circuit as claimed in claim 3, further comprising a trigger circuit controlled by said amplifier/discriminator to supply said trigger pulse to said thyratron in response to said indicating signal and an external trigger input signal.

* * * * *